United States Patent
Gan

(10) Patent No.: US 10,403,648 B2
(45) Date of Patent: Sep. 3, 2019

(54) ARRAY SUBSTRATES WITH ADJACENT SUB-PIXELS HAVING OPPOSITE POLARITIES

(71) Applicant: Shenzhen China Star Optoelectronics Semiconductor Display Technology Co., Ltd., Shenzhen, Guangdong (CN)

(72) Inventor: Qiming Gan, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/739,731

(22) PCT Filed: Sep. 21, 2017

(86) PCT No.: PCT/CN2017/102542
§ 371 (c)(1),
(2) Date: Dec. 24, 2017

(87) PCT Pub. No.: WO2019/015078
PCT Pub. Date: Jan. 24, 2019

(65) Prior Publication Data
US 2019/0027496 A1    Jan. 24, 2019

(51) Int. Cl.
*G09G 3/20* (2006.01)
*H01L 27/12* (2006.01)
(Continued)

(52) U.S. Cl.
CPC ......... *H01L 27/124* (2013.01); *G09G 3/2003* (2013.01); *G09G 3/3666* (2013.01);
(Continued)

(58) Field of Classification Search
CPC ......... G09G 3/3614; G09G 2300/0426; G09G 2310/0281; H01L 27/124
See application file for complete search history.

(56) References Cited

U.S. PATENT DOCUMENTS

| 2008/0204434 A1 | 8/2008 | Lee et al. |
| 2010/0053487 A1 | 3/2010 | Wu et al. |

(Continued)

FOREIGN PATENT DOCUMENTS

| CN | 104698637 A | 6/2015 |
| CN | 105353545 A | 2/2016 |
| CN | 105676496 A | 6/2016 |

*Primary Examiner* — Daniel Whalen
(74) *Attorney, Agent, or Firm* — Andrew C. Cheng

(57) ABSTRACT

The present disclosure relates to an array substrate and a display panel. The array substrate includes a first driving chip and a second driving chip configured on the top and the bottom of the array substrate respectively. Data lines on the first 6a number of columns connect to the first pins of the first driving chip, and data lines on the second 6a number of columns connect to the second pins of the second driving chip, and remaining data lines connects to the first pins and the second pins in an alternating manner. Such that, three sub-pixels within the same pixel may be driven by the driving chip configured on the same side, and the adjacent first pins and the adjacent second pins may output the signals with different polarities. So as to achieve the dot inversion of the polarities among the sub-pixels.

11 Claims, 3 Drawing Sheets

(51) Int. Cl.
*G09G 3/36* (2006.01)
*G02F 1/1362* (2006.01)
(52) U.S. Cl.
CPC ............. *G02F 1/136286* (2013.01); *G09G 2300/0426* (2013.01); *G09G 2300/0823* (2013.01); *G09G 2310/0224* (2013.01); *G09G 2370/08* (2013.01)

(56) References Cited

U.S. PATENT DOCUMENTS

| | | | | |
|---|---|---|---|---|
| 2013/0016137 A1* | 1/2013 | Nakagawa | ........... | G09G 3/3614 345/690 |
| 2014/0184672 A1* | 7/2014 | Chen | ................ | G02F 1/13306 345/698 |
| 2016/0180785 A1 | 6/2016 | Jin et al. | | |

* cited by examiner

ARRAY SUBSTRATES WITH ADJACENT SUB-PIXELS HAVING OPPOSITE POLARITIES

BACKGROUND

1. Technical Field

The present disclosure relates to display field, more particularly to an array substrate and a display panel.

2. Description of Related Art

With respect to Liquid crystal display (LCD) panels, a liquid crystal layer is configured between two glass substrates. The upper-layer of the glass substrate may be a color filter substrate, and the down-layer of the glass substrate may be an array substrate configured with thin film transistors (TFTs). Color resistance is formed on the color filter substrate corresponding to the TFT. Wherein each of the pixels on the panel may include a red sub-pixel, a green sub-pixel, and a blue sub-pixel respectively. When current pass through the TFT to generate the difference of electric field, resulting in deflection of liquid crystal molecular, the state of each of sub-pixels may be determined. The color displayed by the pixel may be obtained by mixing the color of the red sub-pixel, the green sub-pixel, and the blue sub-pixel, and the display images of the panel is formed by the combination of all pixels. However, the display images may be flashing due to the same polarity of the adjacent pixels. Therefore, the sub-pixels on the panel may usually be designed according to a dot inversion arrangement to avoid the flashing of the images.

Due to the resolution of the panels becomes higher and higher, the panel may include much more data lines with the same size. The more data lines are configured within the panel, the more driving chips are needed to introduce external signals to the panel. However, the driving chip may only include a certain number of pins, and the manufacturing space is required between the adjacent chips. Therefore, conventionally, the signals of the data lines may be fed into the panel by a cross-feeding method, that is the signals of the data lines may be fed from the top and the bottom of the panel, when the panel includes a great amount of data lines.

By conducting the cross-feeding method, the odd-number data lines are fed from the top of the panel, and the even-number data lines are fed from the bottom of the panel. The first data line, the second data line, the fifth data line, and the sixth data line may output the signals with a positive polarity, and the third data line, fourth data line, and the seventh data line may output the signals with a negative polarity. As such, the adjacent sub-pixels may not have different polarities. In addition, the conventional structure of the array substrate may not satisfy the demand that the three sub-pixels of the same pixel are driven by the driving chip configured on the same side.

SUMMARY

The present disclosure relates to an an array substrate, including: a display area and a rim area; wherein the display area includes (m+1) number of data lines, n number of scanning lines, and a plurality of sub-pixels being arranged in array having n number of rows and m number of columns; the sub-pixels configured on each rows are connected to one corresponding scanning line; with respect to the sub-pixels arranged on the same column, the sub-pixels arranged on the odd-number rows and the sub-pixels arranged on the even-number rows are respectively connected to adjacent data line arranged on left side and to adjacent data line arranged on right side; the sub-pixels on the same column are configured with the same color; the rim area includes at least one first driving chip configured on a top area of the display area, at least one second driving chip configured on a bottom area of the display area, and at least one third driving chip configured on a lateral area of the display area, wherein the first driving chip includes a plurality of first pins, the second driving chip includes a plurality of second pins, the third driving chip connects with the scanning lines to input gate driving signals to the sub-pixels; data lines on the first 6b number of columns connect to the first pins of the first driving chip, and data lines on the second 6b number of columns connect to the second pins of the second driving chip, and remaining data lines connects to the first pins and the second pins in an alternating manner, and the three sub-pixels within the same pixel are driven by the driving chip configured on the same side; the signals outputted from the two adjacent first pins have different polarities, and the signals outputted from the two adjacent second pins have different polarities, so that each of the sub-pixels has different polarities when being compared with the adjacent sub-pixels; wherein b, n, and m are positive integers.

In another aspect, the present disclosure further relates to an array substrate, including: a display area and a rim area; wherein the display area includes a plurality of data lines, a plurality of scanning lines intersecting with the data lines, and a plurality of sub-pixels being arranged in array; the sub-pixels configured on each rows are connected to one corresponding scanning line; with respect to the sub-pixels arranged on the same column, the sub-pixels arranged on the odd-number rows and the sub-pixels arranged on the even-number rows are respectively connected to adjacent data line arranged on left side and to adjacent data line arranged on right side; the sub-pixels on the same column may configured with the same color; the rim area includes at least one first driving chip configured on a top area of the display area, at least one second driving chip configured on a bottom area of the display area, wherein the first driving chip includes a plurality of first pins, the second driving chip includes a plurality of second pins; data lines on the first 6b number of columns connect to the first pins of the first driving chip, and data lines on the second 6b number of columns connect to the second pins of the second driving chip, and remaining data lines connects to the first pins and the second pins in an alternating manner, and the three sub-pixels within the same pixel are driven by the driving chip configured on the same side; the signals outputted from the two adjacent first pins have different polarities, and the signals outputted from the two adjacent second pins have different polarities, so that each of the sub-pixels has different polarities when being compared with the adjacent sub-pixels; wherein b, n, and m are positive integers.

In another aspect, the present disclosure further relates to an array substrate, including: a display area and a rim area; wherein the display area includes a plurality of data lines, a plurality of scanning lines intersecting with the data lines, and a plurality of sub-pixels being arranged in array; the sub-pixels configured on each rows are connected to one corresponding scanning line; with respect to the sub-pixels arranged on the same column, the sub-pixels arranged on the odd-number rows and the sub-pixels arranged on the even-number rows are respectively connected to adjacent data line arranged on left side and to adjacent data line arranged on right side; the sub-pixels on the same column are configured with the same color; the rim area includes a first short-connecting-pin area configured on a top area of the display area, a second short-connecting-pin area configured on a bottom area of the display area, and a third short-connecting-pin area configured on a lateral area of the display area, wherein the first short-connecting-pin area includes a first short-connecting-pin, a second short-connecting-pin, and a third short-connecting-pin configured in a horizontal direction, the second short-connecting-pin area includes a fourth short-connecting-pin, a fifth short-connecting-pin, and a sixth short-connecting-pin configured in the horizontal direction, and the third short-connecting-pin area includes a seventh short-connecting-pin and an eighth short-connecting-pin configured in a vertical direction; the first short-connecting-pin area and the second short-connecting-pin area alternatively connect with data lines of 6b columns, the three sub-pixels within the same pixel are driven by the driving chip configured on the same side, the seventh short-connecting-pin connects with the scanning lines on odd-number rows, and the eighth short-connecting-pin connects with the scanning lines on even-number rows; and b is a positive integer.

In view of the above, the first driving chip and the second driving chip are configured on the top and the bottom of the array substrate respectively. Data lines on the first 6b number of columns connect to the first pins of the first driving chip, and data lines on the second 6b number of columns connect to the second pins of the second driving chip, and remaining data lines connects to the first pins and the second pins in an alternating manner. Such that, three sub-pixels within the same pixel may be driven by the driving chip configured on the same side, and the adjacent first pins and the adjacent second pins may output the signals with different polarities. So as to achieve the dot inversion of the polarities among the sub-pixels and to reduce the flashing of the images.

DETAILED DESCRIPTION

Figure 1:
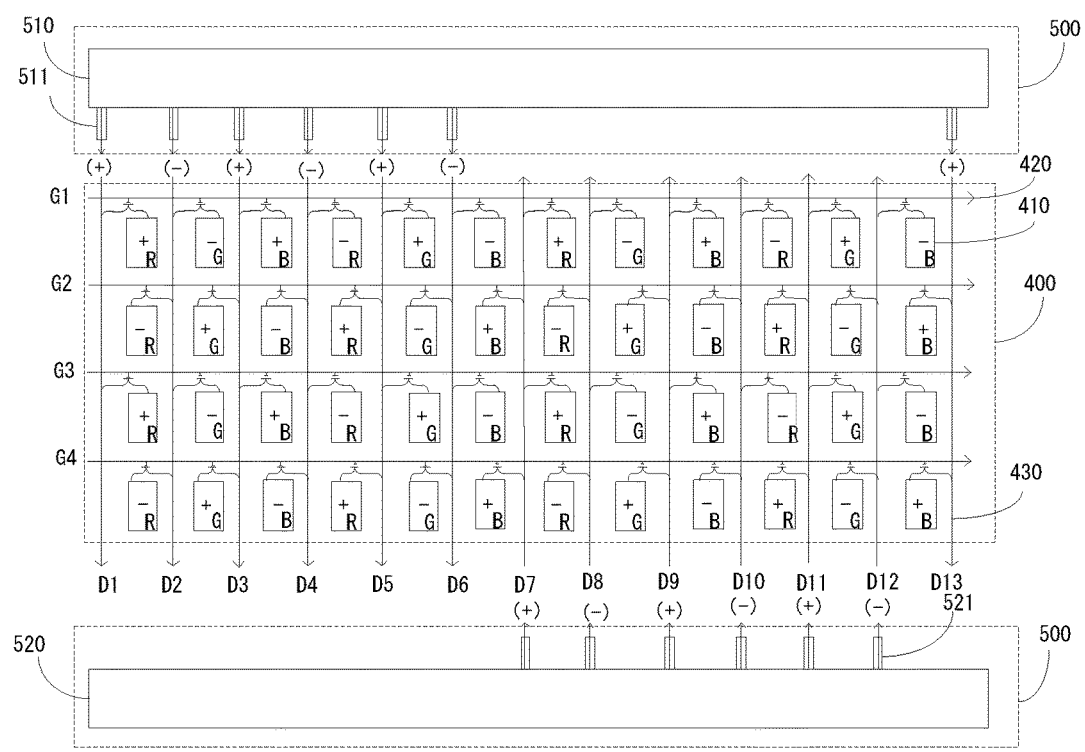
FIG. 1 is a schematic view of an array substrate in accordance with one embodiment of the present disclosure.

Referring to FIG. 1, the present disclosure relates to an array substrate, including a display area 400 and a rim area 500.

The display area 400 includes a plurality of data lines 420, a plurality of scanning lines 430 intersecting with the data lines 420, and a plurality of sub-pixels 410 being arranged in array. The sub-pixels 410 configured on each rows of the array are connected to one corresponding scanning line 420. With respect to the sub-pixels 410 arranged on the same column, the sub-pixels 410 arranged on the odd-number rows and the sub-pixels 410 arranged on the even-number rows are respectively connected to adjacent data line 410 arranged on left side and to adjacent data line 410 arranged on right side. Specifically, the array may include red sub-pixel, green sub-pixel, and blue sub-pixel, and the sub-pixels 410 on the same column are configured with the same color. For example, the sub-pixels configured on a first column and a fourth column may be the red sub-pixel. The sub-pixels configured on a second column and a fifth column may be the green sub-pixel. The sub-pixels configured on a third column and a sixth column may be the blue sub-pixel.

The rim area 500 includes at least one first driving chip 510 configured on a top area of the display area 400, at least one second driving chip 520 configured on a bottom area of the display area 400. Wherein the first driving chip 510 may include a plurality of first pins 511, and the second driving chip may include a plurality of second pins 521.

In one example, the rim area 500 may include one first driving chip 510 and one second driving chip 520. In another example, the number of the first driving chip 510 and second driving chip 520 may be determined according to size, resolution, and size of chips of a display panel.

The data lines 430 are divided to N number of sets, wherein each of the N-th data-line sets includes six data lines 430, wherein N is a positive integer. The N-th data-line set connects to the first pins 511 of the first driving chip 510 when N is an odd number, and the N-th data-line set connects to the second pins 521 of the second driving chip 520 when N is an even number. The data lines 430 on the first 6b number of columns connect to the first pins 511 of the first driving chip 510, and data lines 430 on the second 6b number of columns connect to the second pins 521 of the second driving chip 520, and remaining data lines 430 connects to the first pins 510 and the second pins 520 in an alternating manner. As such, the three sub-pixels 410 within the same pixel may be driven by the driving chip configured on the same side.

In one example, each of the 6b columns of the data lines 430 connect with the first driving chip 510 via the first pins 511 or connect with the second driving chip 520 via the 521. In another example, the rim area 500 may include more than one first driving chip 510 or the second driving chip 520, each of the 6b columns of the data lines 430 may be connected by at least two adjacent pins of the first driving chip 510 or may be connected by at least two adjacent pins of the second driving chip 520. That is, the three sub-pixels 410 within the same pixel are driven by the driving chip configured on the same side, and the three sub-pixels 410 within the same pixel need not to be driven by the same driving chip.

The signals outputted from the two adjacent first pins 511 of the first driving chip 510 have different polarities. The signals outputted from the two adjacent second pins 521 of the second driving chip 520 have different polarities. That is, the signals from the first pins 511 and the signals from the second pins 521 are configured in an alternating positive-negative manner. As shown in FIG. 1, each of the sub-pixels 410 has different polarities when being compared with the adjacent sub-pixels. So as to achieve the dot inversion of the polarities among the sub-pixels 410 and to reduce the flashing of the images. Wherein b is a positive integer, such as 1, 2, or 5.

In view of the above, the first driving chip and the second driving chip are configured on the top and the bottom of the array substrate respectively. The data lines on the first 6b number of columns connect to the first pins of the first driving chip, and the data lines on the second 6b number of columns connect to the second pins of the second driving chip, and remaining data lines connects to the first pins and the second pins in an alternating manner. Such that, three sub-pixels within the same pixel may be driven by the driving chip configured on the same side, and the adjacent first pins and the adjacent second pins may output the signals with different polarities. So as to achieve the dot inversion of the polarities among the sub-pixels and to reduce the flashing of the images.

In one example, the array may include n number of rows and m number of columns. The display area may include n number of scanning lines and (m+1) number of data lines, which may include the data lines from the first data line to the (m+1)-th data lines. Wherein n and m are positive integers, such as 5 or 10.

In one example, when b is equal to 1, the first pins 511 of the first driving chip 510 respectively connect with the first data line, a second data line, a third data line, a fourth data line, a fifth data line, and a sixth data line. The second pins 521 of the second driving chip 520 respectively connect with a seventh data line, an eighth data line, a ninth data line, a tenth data line, an eleventh data line, and a twelfth data line. The first pins and the second pins alternatively connect with subsequent data lines by six data lines each time, and the remaining data lines are connected to the first pins of the first driving chip and the second pins in alternating manner.

The signals outputted from the data lines of the odd-number columns may have positive polarities, and the signals outputted from the data lines of the even-number columns may have negative polarities. Specifically, the first column, the third column, and the fifth column of the data lines 430 output the signals with the positive polarities. The second column, the fourth column, and the sixth column of the data lines 430 output the signals with the negative polarities. As such, each of the sub-pixels 410 may have different polarities when being compared with the adjacent sub-pixels.

Figure 2:
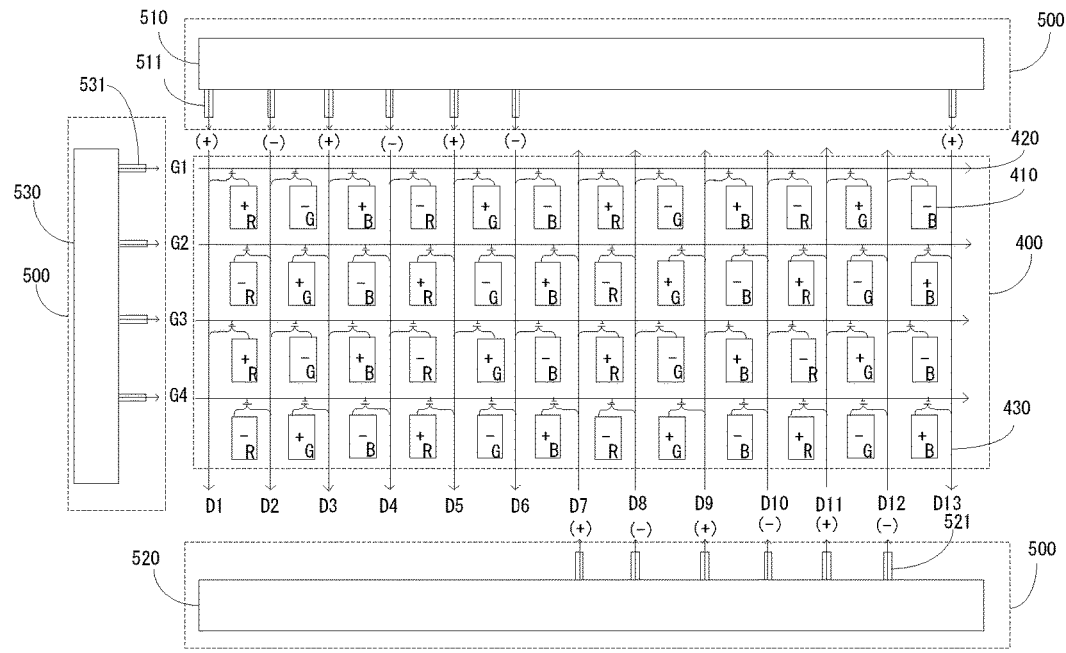
FIG. 2 is a schematic view of an array substrate in accordance with another embodiment of the present disclosure.

As shown in FIG. 2, FIG. 2 is a schematic view of an array substrate in accordance with another embodiment of the present disclosure.

The rim area 500 may further include at least one third driving chip 530 configured on a lateral area of the display area 400. In one example, the third driving chip 530 may be configured on a left side of the display area 400. The third driving chip 530 may connect with the scanning lines 420 to input gate driving signals to the sub-pixel 410.

In one example, as shown in FIG. 2, the rim area 500 may include one third driving chip 530. In another example, the number of the third driving chip 530 may be determined according to size, resolution, and size of chips of the display panel.

Figure 3:
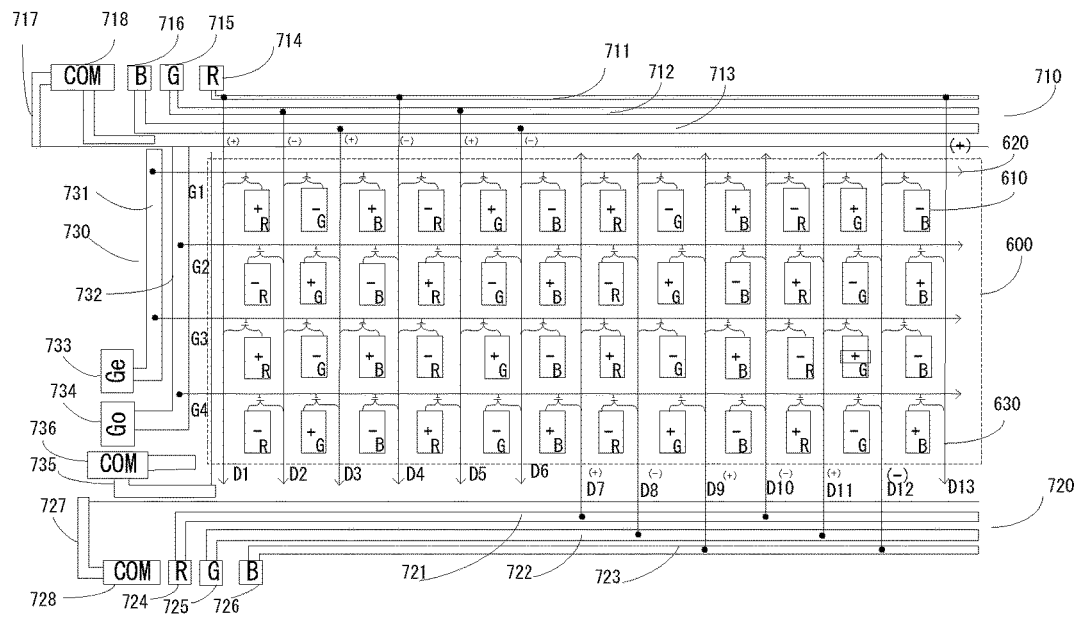
FIG. 3 is a schematic view of an array substrate in accordance with another embodiment of the present disclosure.

Referring to FIG. 3, the present disclosure further relates to the array substrate, including: a display area 600 and a rim area 700.

The display area 600 may include a plurality of data lines 630, a plurality of scanning lines 620 intersecting with the data lines 630, and a plurality of sub-pixels 610 being arranged in array. The sub-pixels 610 configured on each rows of the array are connected to one corresponding scanning line 620. With respect to the sub-pixels 610 arranged on the same column, the sub-pixels 610 arranged on the odd-number rows and the sub-pixels 610 arranged on the even-number rows are respectively connected to adjacent data line 630 arranged on left side and to adjacent data line 630 arranged on right side. The sub-pixels 610 on the same column are configured with the same color.

The rim area 700 may include a first short-connecting-pin area 710 configured on the top area of the display area 600, a second short-connecting-pin area 720 configured on the bottom area of the display area 600, and a third short-connecting-pin area 730 configured on the lateral area of the display area 600. Wherein the first short-connecting-pin area 710 includes a first short-connecting-pin 711, a second short-connecting-pin 712, and a third short-connecting-pin 713 configured in a horizontal direction. The second short-connecting-pin area 720 includes a fourth short-connecting-pin 721, a fifth short-connecting-pin 722, and a sixth short-connecting-pin 723 configured in the horizontal direction. The third short-connecting-pin area 730 includes a seventh short-connecting-pin 731 and an eighth short-connecting-pin 732 configured in a vertical direction.

The data lines 630 are divided to N number of sets, wherein each of the N-th data-line sets includes six data lines 630, wherein N is a positive integer. The N-th data-line set connects to the first short-connecting-pin area 710 when N is an odd number, and the N-th data-line set connects to the second short-connecting-pin area 720 when N is an even number. The data lines 630 on the first 6b number of columns connect to the first short-connecting-pin area 710, and the data lines 630 on the second 6b number of columns connect to the second short-connecting-pin area 720, and the remaining data lines 630 connects to the first short-connecting-pin area 710 and the second short-connecting-pin area 720 in an alternating manner. As such, the three sub-pixels 610 within the same pixel are driven by the driving chip configured on the same side. The seventh short-connecting-pin 731 connects with the scanning lines 620 on odd-number rows, and the eighth short-connecting-pin 732 connects with the scanning lines 620 on even-number rows. Specifically, b is a positive integer, such as 1, 2, or 5.

In one example, the first short-connecting-pin area 710 may further include a first conductive pad 714, a second conductive pad 715, and a third conductive pad 716. The first short-connecting-pin 711 connects with the first conductive pad 714. The second short-connecting-pin 712 connects with the second conductive pad 715. The third short-connecting-pin 713 connects with the third conductive pad 716. The second short-connecting-pin area 720 may further include a fourth conductive pad 724, a fifth conductive pad 725, and a sixth conductive pad 726. The fourth short-connecting-pin 721 connects with the fourth conductive pad 724. The fifth short-connecting-pin 722 connects with the fifth conductive pad 725. The sixth short-connecting-pin 723 connects with the sixth conductive pad 726. The third short-connecting-pin area 730 may further include a seventh conductive pad 733 and an eighth conductive pad 734. The seventh short-connecting-pin 731 connects with the seventh conductive pad 733. The eighth short-connecting-pin 732 connects with the eighth conductive pad 734.

In one example, the sub-pixel 610 may include the red sub-pixel, the green sub-pixel, and the blue sub-pixel. When the seventh short-connecting-pin 731 provide the gate driving signals to the scanning lines 620 on the odd-number rows and the first short-connecting-pin 731 and the fourth short-connecting-pin 721 provide signals to the data lines 630, the red pixels configured on the odd-number rows may be illuminated. If any of the red pixels is not illuminated, such red pixel is configured to be short-connected or open circuit. When the second short-connecting-pin 712 and the fifth short-connecting-pin 722 provide signals to the data lines 630, the green pixels configured on the odd-number rows are illuminated. If any of the green pixels is not illuminated, such green pixel is configured to be short-connected or open circuit. When the third short-connecting-pin 713 and the sixth short-connecting-pin 723 provide signals to the data lines 630, the blue pixels configured on the odd-number rows are illuminated. If any of the blue pixels is not illuminated, such blue pixel is configured to be short-connected or open circuit.

When the eighth short-connecting-pin 732 provide the gate driving signals to the scanning lines 620 on the even-number rows and the first short-connecting-pin 711 and the fourth short-connecting-pin 721 provide signals to the data lines 630, the blue pixels configured on the even-number rows are illuminated. If any of the blue pixels is not illuminated, such blue pixel is configured to be short-connected or open circuit. When the second short-connecting-pin 712 and the fifth short-connecting-pin 722 provide signals to the data lines 630, the red pixels configured on the even-number rows are illuminated. If any of the red pixels is not illuminated, such red pixel is configured to be short-connected or open circuit. When the third short-connecting-pin 713 and the sixth short-connecting-pin 723 provide signals to the data lines 630, the green pixels configured on the even-number rows are illuminated. If any of the green pixels is not illuminated, such green pixel is configured to be short-connected or open circuit.

As such, if the same pixel is connected by the same short-connecting-pin area, the point screen detection may be conducted on the signals of each of the sub-pixels 610. The short-connected and the open circuit of the pixel can be detected in time, and performance of detection may be improved.

In one example, the first short-connecting-pin area 710 may further include a ninth short-connecting-pin 717 and a ninth conductive pad 718 connecting with the ninth short-connecting-pin 717. The second short-connecting-pin area 720 may further include a tenth short-connecting-pin 727 and a tenth conductive pad 728 connecting with the tenth short-connecting-pin 727. The third short-connecting-pin area 730 may further include an eleventh short-connecting-pin 735 and an eleventh conductive pad 736 connecting with the eleventh short-connecting-pin 735. The ninth short-connecting-pin 717, the tenth short-connecting-pin 727, and the eleventh short-connecting-pin 735 respectively connect with a common electrode (not shown in the figure).

Figure 4:
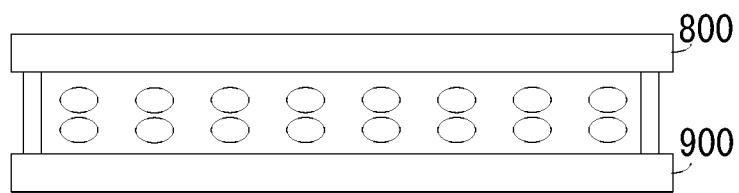
FIG. 4 is a schematic view of a display panel in accordance with another embodiment of the present disclosure.

Referring to FIG. 4, the present disclosure further relates to a display panel, including a first substrate 900 and a second substrate 800.

The first substrate 900 is opposite to the second substrate 800. Specifically, the first substrate 900 may be the array substrate of any embodiment described above, and the detail structure of the array substrate may not be described again.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. An array substrate, comprising:
a display area and a rim area;
wherein the display area comprises (m+1) number of data lines, n number of scanning lines, and a plurality of sub-pixels being arranged in array having n number of rows and m number of columns;
the sub-pixels configured on each rows are connected to one corresponding scanning line;
with respect to the sub-pixels arranged on the same column, the sub-pixels arranged on the odd-number rows and the sub-pixels arranged on the even-number rows are respectively connected to adjacent data line arranged on left side and to adjacent data line arranged on right side;
the sub-pixels on the same column are configured with the same color;
the rim area comprises at least one first driving chip configured on a top area of the display area, at least one second driving chip configured on a bottom area of the display area, and at least one third driving chip configured on a lateral area of the display area, wherein the first driving chip comprises a plurality of first pins, the second driving chip comprises a plurality of second pins, the third driving chip connects with the scanning lines to input gate driving signals to the sub-pixels;
data lines on first 6b number of columns connect to the first pins of the first driving chip, and data lines on second 6b number of columns connect to the second pins of the second driving chip, and remaining data lines connects to the first pins and the second pins in an alternating manner, and the three sub-pixels within the same pixel are driven by the driving chip configured on the same side;
the signals outputted from the two adjacent first pins have different polarities, and the signals outputted from the two adjacent second pins have different polarities, so that each of the sub-pixels has different polarities when being compared with the adjacent sub-pixels;
wherein b, n, and m are positive integers.

2. The array substrate according to claim 1, wherein the first pins of the first driving chip respectively connect with the first data line, a second data line, a third data line, a fourth data line, a fifth data line, and a sixth data line, the second pins of the second driving chip respectively connect with a seventh data line, an eighth data line, a ninth data line, a tenth data line, an eleventh data line, and a twelfth data line, and the first pins and the second pins alternatively connect with subsequent data lines by six data lines each time until the first pins of the first driving chip and the second pins of the second driving chip connect with all of the (m+1) number of data lines.

3. The array substrate according to claim 2, wherein the signals outputted from the data lines configured on the odd-number columns have positive polarities, and the signals outputted from the data lines configured on the even-number columns have negative polarities.

4. An array substrate, comprising:
a display area and a rim area;
wherein the display area comprises a plurality of data lines, a plurality of scanning lines intersecting with the data lines, and a plurality of sub-pixels being arranged in array;
the sub-pixels configured on each rows are connected to one corresponding scanning line;
with respect to the sub-pixels arranged on the same column, the sub-pixels arranged on the odd-number rows and the sub-pixels arranged on the even-number rows are respectively connected to adjacent data line arranged on left side and to adjacent data line arranged on right side;
the sub-pixels on the same column are configured with the same color;
the rim area comprises at least one first driving chip configured on a top area of the display area, at least one second driving chip configured on a bottom area of the display area, wherein the first driving chip comprises a plurality of first pins, the second driving chip comprises a plurality of second pins;
data lines on first 6b number of columns connect to the first pins of the first driving chip, and data lines on second 6b number of columns connect to the second pins of the second driving chip, and remaining data lines connects to the first pins and the second pins in an alternating manner, and the three sub-pixels within the same pixel are driven by the driving chip configured on the same side;

the signals outputted from the two adjacent first pins have different polarities, and the signals outputted from the two adjacent second pins have different polarities, so that each of the sub-pixels has different polarities when being compared with the adjacent sub-pixels;

wherein b is a positive integer a, n, and m are positive integers.

5. The array substrate according to claim 4, wherein the array comprises n number of rows and m number of columns, the display area comprises n number of scanning lines and (m+1) number of data lines;

wherein n and m are positive integers.

6. The array substrate according to claim 5, wherein the first pins of the first driving chip respectively connect with the first data line, a second data line, a third data line, a fourth data line, a fifth data line, and a sixth data line, the second pins of the second driving chip respectively connect with a seventh data line, an eighth data line, a ninth data line, a tenth data line, an eleventh data line, and a twelfth data line, and the first pins and the second pins alternatively connect with subsequent data lines by six data lines each time until the first pins of the first driving chip and the second pins of the second driving chip connect with all of the (m+1) number of data lines.

7. The array substrate according to claim 6, wherein the signals outputted from the data lines configured on the odd-number columns have positive polarities, and the signals outputted from the data lines configured on the even-number columns have negative polarities.

8. The array substrate according to claim 4, wherein the rim area further comprise at least one third driving chip configured on a lateral area of the display area, and third driving chip connects with the scanning lines to input gate driving signals to the sub-pixels.

9. An array substrate, comprising:
a display area and a rim area;
wherein the display area comprises a plurality of data lines, a plurality of scanning lines intersecting with the data lines, and a plurality of sub-pixels being arranged in array;
the sub-pixels configured on each rows are connected to one corresponding scanning line;
with respect to the sub-pixels arranged on the same column, the sub-pixels arranged on the odd-number rows and the sub-pixels arranged on the even-number rows are respectively connected to adjacent data line arranged on left side and to adjacent data line arranged on right side;
the sub-pixels on the same column are configured with the same color;
the rim area comprises a first short-connecting-pin area configured on a top area of the display area, a second short-connecting-pin area configured on a bottom area of the display area, and a third short-connecting-pin area configured on a lateral area of the display area, wherein the first short-connecting-pin area comprises a first short-connecting-pin, a second short-connecting-pin, and a third short-connecting-pin configured in a horizontal direction, the second short-connecting-pin area comprises a fourth short-connecting-pin, a fifth short-connecting-pin, and a sixth short-connecting-pin configured in the horizontal direction, and the third short-connecting-pin area comprises a seventh short-connecting-pin and an eighth short-connecting-pin configured in a vertical direction;

data lines on the first 6b number of columns connect to the first short-connecting-pin area, and data lines on the second 6b number of columns connect to the second short-connecting-pin area, and the remaining data lines connects to the first short-connecting-pin area and the second short-connecting-pin area in an alternating manner, and the three sub-pixels within the same pixel are driven by the driving chip configured on the same side, the seventh short-connecting-pin connects with the scanning lines on odd-number rows, and the eighth short-connecting-pin connects with the scanning lines on even-number rows;

wherein b is a positive integer.

10. The array substrate according to claim 9, wherein the sub-pixel comprises a red sub-pixel, a green sub-pixels, and a blue sub-pixels, when the seventh short-connecting-pin provide the gate driving signals to the scanning lines on the odd-number rows and the first short-connecting-pin and the fourth short-connecting-pin provide signals to the data lines, the red pixels configured on the odd-number rows are illuminated; when the second short-connecting-pin and the fifth short-connecting-pin provide signals to the data lines, the green pixels configured on the odd-number rows are illuminated; when the third short-connecting-pin and the sixth short-connecting-pin provide signals to the data lines, the blue pixels configured on the odd-number rows are illuminated;

when the eighth short-connecting-pin provide the gate driving signals to the scanning lines on the even-number rows and the first short-connecting-pin and the fourth short-connecting-pin provide signals to the data lines, the blue pixels configured on the even-number rows are illuminated; when the second short-connecting-pin and the fifth short-connecting-pin provide signals to the data lines, the red pixels configured on the even-number rows are illuminated; when the third short-connecting-pin and the sixth short-connecting-pin provide signals to the data lines, the green pixels configured on the even-number rows are illuminated.

11. The array substrate according to claim 9, wherein the first short-connecting-pin area further comprises a ninth short-connecting-pin, the second short-connecting-pin area further comprises a tenth short-connecting-pin, the third short-connecting-pin area further comprises an eleventh short-connecting-pin, and the ninth short-connecting-pin, tenth short-connecting-pin, and the eleventh short-connecting-pin respectively connect with a common electrode.

* * * * *